(12) United States Patent
Masmoudi et al.

(10) Patent No.: US 11,922,314 B1
(45) Date of Patent: Mar. 5, 2024

(54) SYSTEMS AND METHODS FOR BUILDING DYNAMIC REDUCED ORDER PHYSICAL MODELS

(71) Applicant: ANSYS, INC., Canonsburg, PA (US)

(72) Inventors: Mohamed Masmoudi, Toulouse (FR); Christelle Boichon-Grivot, Chozeau (FR); Valéry Morgenthaler, Villeurbanne (FR); Michel Rochette, Lyons (FR)

(73) Assignee: ANSYS, INC., Canonsburg, PA (US)

( * ) Notice: Subject to any disclaimer, the term of this patent is extended or adjusted under 35 U.S.C. 154(b) by 1088 days.

(21) Appl. No.: 16/527,387

(22) Filed: Jul. 31, 2019

Related U.S. Application Data

(60) Provisional application No. 62/773,555, filed on Nov. 30, 2018.

(51) Int. Cl.
*G06N 3/084* (2023.01)
*G06F 30/00* (2020.01)
*G06N 3/048* (2023.01)

(52) U.S. Cl.
CPC .......... *G06N 3/084* (2013.01); *G06F 30/00* (2020.01); *G06N 3/048* (2023.01)

(58) Field of Classification Search
CPC ....... G06N 3/084; G06N 3/0481; G06F 30/00
See application file for complete search history.

(56) References Cited

U.S. PATENT DOCUMENTS

| | | | | |
|---|---|---|---|---|
| 5,046,020 A | * | 9/1991 | Filkin | G06N 3/08 706/25 |
| 5,467,428 A | * | 11/1995 | Ulug | G06N 20/00 706/41 |
| 6,826,521 B1 | * | 11/2004 | Hess | G05B 13/048 703/12 |
| 9,830,526 B1 | * | 11/2017 | Lin | G06F 18/10 |
| 10,373,027 B1 | * | 8/2019 | Kim | G06F 18/2148 |
| 10,402,720 B2 | * | 9/2019 | Annapureddy | G06N 3/08 |
| 10,521,715 B1 | * | 12/2019 | Ioffe | G06N 3/044 |

(Continued)

OTHER PUBLICATIONS

"ANSYS Mechanical APDL Structural Analysis Guide," Release 15.0, Nov. 2013, 552 pages.

(Continued)

*Primary Examiner* — Charles L Beard
(74) *Attorney, Agent, or Firm* — Womble Bond Dickinson (US) LLP

(57) ABSTRACT

Methods and apparatuses that generate a simulation object for a physical system are described. The simulation object includes a trained computing structure to determine future output data of the physical system in real time. The computing structure is trained with a plurality of input units and one or more output units. The plurality of input units include regular input units to receive input data and output data of the physical system. The output units include one or more regular output units to predict a dynamic rate of change of the input data over a period of time. The input data and output data of the physical system are obtained for training the computing structure. The input data represent a dynamic input excitation to the physical system over the period of time. And the output data represents a dynamic output response of the physical system to the dynamic input excitation over the period of time.

18 Claims, 8 Drawing Sheets

(56) References Cited

U.S. PATENT DOCUMENTS

| | | | | |
|---|---|---|---|---|
| 10,567,237 B1* | 2/2020 | Powell | H04L 41/16 |
| 10,691,133 B1* | 6/2020 | Abeloe | G05D 1/0088 |
| 11,093,714 B1* | 8/2021 | Bhatia | G06N 3/044 |
| 11,126,660 B1* | 9/2021 | Sen | G06N 3/044 |
| 11,164,069 B1* | 11/2021 | Korsunsky | G06N 3/045 |
| 11,170,262 B2* | 11/2021 | Kuroda | G06F 18/2155 |
| 11,175,958 B2* | 11/2021 | Gupta | G06F 9/505 |
| 11,175,959 B2* | 11/2021 | Gupta | G06F 9/5083 |
| 11,176,416 B2* | 11/2021 | Hashimoto | G06N 3/084 |
| 11,341,745 B1* | 5/2022 | McDowell | G06N 3/048 |
| 11,354,463 B1* | 6/2022 | Babaali | G06F 8/35 |
| 11,386,327 B2* | 7/2022 | Zhang | G06N 7/00 |
| 11,416,654 B2* | 8/2022 | Park | G06N 5/01 |
| 11,421,610 B2* | 8/2022 | Chae | F02N 99/002 |
| 11,423,263 B2* | 8/2022 | Kobayashi | G06N 20/10 |
| 11,423,884 B2* | 8/2022 | Lee | G10L 15/16 |
| 11,424,764 B2* | 8/2022 | Luo | G06N 3/045 |
| 11,431,406 B1* | 8/2022 | Guthrie | H04B 7/18513 |
| 11,558,620 B2* | 1/2023 | Besenbruch | G06N 3/084 |
| 11,562,249 B2* | 1/2023 | Gokmen | G06N 3/063 |
| 11,562,250 B2* | 1/2023 | Tachibana | G06N 3/084 |
| 11,580,394 B2* | 2/2023 | Lie | G06N 3/08 |
| 11,580,406 B2* | 2/2023 | Chae | G06N 3/048 |
| 11,599,605 B1* | 3/2023 | Pierce | G06F 21/16 |
| 11,599,791 B2* | 3/2023 | Miyauchi | G06N 3/045 |
| 2004/0015459 A1* | 1/2004 | Jaeger | G06N 3/08 706/15 |
| 2007/0239644 A1* | 10/2007 | Minamino | G06N 3/084 706/30 |
| 2008/0147573 A1* | 6/2008 | Hamadi | G06N 20/00 706/19 |
| 2008/0281767 A1* | 11/2008 | Garner | G05B 13/027 706/25 |
| 2009/0300150 A1* | 12/2009 | Rudy | H04L 63/1425 709/222 |
| 2009/0327183 A1* | 12/2009 | Rubin | G06F 30/00 706/45 |
| 2010/0094790 A1* | 4/2010 | Gnojewski | G06N 3/084 706/25 |
| 2012/0290520 A1* | 11/2012 | Frank | G06N 20/00 706/45 |
| 2014/0015852 A1* | 1/2014 | Kantartzis | G06T 11/006 345/619 |
| 2014/0067738 A1* | 3/2014 | Kingsbury | G06N 3/08 706/20 |
| 2014/0129491 A1* | 5/2014 | Sayyar-Rodsari | G06N 3/048 706/12 |
| 2015/0134581 A1* | 5/2015 | Doeding | G06N 3/04 706/25 |
| 2015/0206050 A1* | 7/2015 | Talathi | G06N 3/082 706/15 |
| 2015/0254554 A1* | 9/2015 | Kato | G06N 3/084 706/21 |
| 2015/0356461 A1* | 12/2015 | Vinyals | G06N 20/00 706/12 |
| 2016/0052418 A1* | 2/2016 | Yang | B60L 15/2045 180/65.265 |
| 2016/0063142 A1* | 3/2016 | Tange | G06F 30/00 703/2 |
| 2016/0091913 A1* | 3/2016 | Pani | G05F 1/66 700/291 |
| 2016/0110642 A1* | 4/2016 | Matsuda | G06N 3/045 706/25 |
| 2017/0076196 A1* | 3/2017 | Sainath | G06N 3/084 |
| 2017/0205809 A1* | 7/2017 | Sayyarrodsari | G05B 13/048 |
| 2017/0205813 A1* | 7/2017 | Sayyarrodsari | G05B 19/41885 |
| 2017/0353361 A1* | 12/2017 | Chopra | H04L 41/0897 |
| 2018/0005070 A1* | 1/2018 | Lin | G06V 10/454 |
| 2018/0025271 A1* | 1/2018 | Sawada | G06F 17/16 706/25 |
| 2018/0046902 A1* | 2/2018 | Liao | G06N 3/045 |
| 2018/0060160 A1* | 3/2018 | Fang | H03M 13/1525 |
| 2018/0253818 A1* | 9/2018 | John | G06N 20/00 |
| 2018/0276503 A1* | 9/2018 | Okuno | G06V 10/82 |
| 2018/0285694 A1* | 10/2018 | Kobayashi | G06F 15/76 |
| 2018/0292270 A1* | 10/2018 | Brady | G01F 15/063 |
| 2018/0307986 A1* | 10/2018 | Kabul | G06F 9/46 |
| 2018/0322386 A1* | 11/2018 | Sridharan | G06F 9/54 |
| 2018/0322607 A1* | 11/2018 | Mellempudi | G06F 7/5443 |
| 2018/0349788 A1* | 12/2018 | Sarkar | G06N 3/08 |
| 2018/0367192 A1* | 12/2018 | O'Shea | G06N 3/044 |
| 2019/0020555 A1* | 1/2019 | Tayal | G06F 9/505 |
| 2019/0042948 A1* | 2/2019 | Lee | H03M 7/24 |
| 2019/0073560 A1* | 3/2019 | Matei | G06V 10/82 |
| 2019/0087722 A1* | 3/2019 | Cho | G06N 3/08 |
| 2019/0087723 A1* | 3/2019 | Cho | G06F 9/46 |
| 2019/0098039 A1* | 3/2019 | Gates | G16H 20/40 |
| 2019/0101877 A1* | 4/2019 | Jiang | G05B 13/048 |
| 2019/0122117 A1* | 4/2019 | Miyazaki | G06N 3/045 |
| 2019/0156203 A1* | 5/2019 | Kang | G06N 3/08 |
| 2019/0188572 A1* | 6/2019 | Lanctot | G06N 3/084 |
| 2019/0197406 A1* | 6/2019 | Darvish Rouhani | G06N 20/00 |
| 2019/0197435 A1* | 6/2019 | Kobayashi | G06N 20/20 |
| 2019/0228312 A1* | 7/2019 | Andoni | G06F 18/2433 |
| 2019/0258934 A1* | 8/2019 | Sorokin | G06N 3/04 |
| 2019/0318755 A1* | 10/2019 | Tashev | G10L 25/30 |
| 2019/0325291 A1* | 10/2019 | Gokmen | G06N 3/045 |
| 2019/0325304 A1* | 10/2019 | Gottin | G06N 3/045 |
| 2019/0332919 A1* | 10/2019 | Weiss | G06N 3/045 |
| 2019/0362238 A1* | 11/2019 | Pietquin | G06N 3/092 |
| 2019/0370176 A1* | 12/2019 | Priyadarshi | G06F 12/0893 |
| 2019/0385047 A1* | 12/2019 | Lei | G06F 30/27 |
| 2020/0019852 A1* | 1/2020 | Yoon | G06N 3/088 |
| 2020/0061570 A1* | 2/2020 | Woods | B01J 19/0006 |
| 2020/0074278 A1* | 3/2020 | Santhar | G06N 3/044 |
| 2020/0090045 A1* | 3/2020 | Baker | G06N 3/006 |
| 2020/0097772 A1* | 3/2020 | Nakanishi | G06N 3/08 |
| 2020/0104678 A1* | 4/2020 | Nixon | G06N 3/042 |
| 2020/0111015 A1* | 4/2020 | Liu | G06N 3/045 |
| 2020/0126126 A1* | 4/2020 | Briancon | G06N 5/01 |
| 2020/0143448 A1* | 5/2020 | Steck | G06Q 30/0631 |
| 2020/0184556 A1* | 6/2020 | Cella | G06Q 30/018 |
| 2020/0236012 A1* | 7/2020 | Tayal | G06N 3/02 |
| 2020/0249642 A1* | 8/2020 | Lu | G06N 3/049 |
| 2020/0249643 A1* | 8/2020 | Lu | G06N 3/044 |
| 2020/0264876 A1* | 8/2020 | Lo | G06N 3/084 |
| 2020/0265298 A1* | 8/2020 | Leobandung | G06F 18/24 |
| 2020/0364333 A1* | 11/2020 | Derks | G06N 20/20 |
| 2020/0372342 A1* | 11/2020 | Nair | G06F 16/2246 |
| 2020/0394520 A1* | 12/2020 | Kruglov | G06N 3/045 |
| 2021/0034960 A1* | 2/2021 | Khapali | G06N 3/08 |
| 2021/0034983 A1* | 2/2021 | Asano | G06N 3/045 |
| 2021/0049462 A1* | 2/2021 | Okumura | G06N 3/044 |
| 2021/0097737 A1* | 4/2021 | Kim | G06N 3/08 |
| 2021/0102527 A1* | 4/2021 | Liu | G05B 23/0254 |
| 2021/0124993 A1* | 4/2021 | Singh | G06V 10/7715 |
| 2021/0125053 A1* | 4/2021 | Faibish | G06N 3/045 |
| 2021/0133378 A1* | 5/2021 | Kosic | G06F 30/27 |
| 2021/0133568 A1* | 5/2021 | Voelker | G06F 7/588 |
| 2021/0142177 A1* | 5/2021 | Mallya | G06N 3/044 |
| 2021/0149605 A1* | 5/2021 | Numata | G06N 3/084 |
| 2021/0158212 A1* | 5/2021 | Kai | G06N 20/00 |
| 2021/0185182 A1* | 6/2021 | Furuya | H04N 1/00196 |
| 2021/0201159 A1* | 7/2021 | Song | G06N 3/088 |
| 2021/0224351 A1* | 7/2021 | Keng | G06N 3/006 |
| 2021/0232854 A1* | 7/2021 | Uemura | G06F 18/24137 |
| 2021/0264209 A1* | 8/2021 | Kim | G06N 3/049 |
| 2021/0266413 A1* | 8/2021 | Imine | H04N 1/00061 |
| 2021/0287089 A1* | 9/2021 | Mayer | G06N 3/08 |
| 2021/0295103 A1* | 9/2021 | Tanniru | G06V 10/7747 |
| 2021/0295191 A1* | 9/2021 | Bui | G06V 10/751 |
| 2021/0303967 A1* | 9/2021 | Bender | G06N 3/08 |
| 2021/0303971 A1* | 9/2021 | Ranade | G06F 18/24 |
| 2021/0326585 A1* | 10/2021 | Tu | G06N 3/047 |
| 2021/0350229 A1* | 11/2021 | Saleh | G06N 3/045 |
| 2021/0365033 A1* | 11/2021 | Segawa | B60W 50/00 |
| 2021/0365840 A1* | 11/2021 | Park | G06F 9/44505 |
| 2021/0366577 A1* | 11/2021 | Koller | G06N 20/00 |
| 2021/0383211 A1* | 12/2021 | Song | G06N 3/08 |
| 2021/0383225 A1* | 12/2021 | Grill | G06N 3/045 |
| 2021/0390400 A1* | 12/2021 | Yao | G06V 10/774 |
| 2021/0406683 A1* | 12/2021 | Kai | G06F 18/211 |

(56) References Cited

U.S. PATENT DOCUMENTS

| | | | |
|---|---|---|---|
| 2021/0406694 A1* | 12/2021 | Kim | G06N 3/084 |
| 2022/0003567 A1* | 1/2022 | Kim | G08G 1/0141 |
| 2022/0014963 A1* | 1/2022 | Yeh | G06N 7/01 |
| 2022/0027465 A1* | 1/2022 | Hercock | G06N 3/044 |
| 2022/0027478 A1* | 1/2022 | Hercock | G06F 21/577 |
| 2022/0027792 A1* | 1/2022 | Cummings | G06N 3/045 |
| 2022/0035889 A1* | 2/2022 | Chou | G06F 17/13 |
| 2022/0036176 A1* | 2/2022 | Megretski | G06N 3/084 |
| 2022/0051094 A1* | 2/2022 | Chentanez | G06N 3/04 |
| 2022/0059117 A1* | 2/2022 | Shor | G06N 3/088 |
| 2022/0060492 A1* | 2/2022 | Giaconi | H04L 63/0245 |
| 2022/0067534 A1* | 3/2022 | Bai | G06N 3/049 |
| 2022/0076057 A1* | 3/2022 | Sumiya | G06F 18/231 |
| 2022/0076100 A1* | 3/2022 | Hori | G06N 3/084 |
| 2022/0079499 A1* | 3/2022 | Doron | G16H 20/40 |
| 2022/0084704 A1* | 3/2022 | Abdel-Khalik | G06N 20/00 |
| 2022/0091713 A1* | 3/2022 | Le | G06F 40/30 |
| 2022/0094647 A1* | 3/2022 | Le | H04L 51/02 |
| 2022/0108131 A1* | 4/2022 | Kuen | G06T 7/00 |
| 2022/0114047 A1* | 4/2022 | Rhee | G06F 11/1008 |
| 2022/0114455 A1* | 4/2022 | Samek | G06N 3/084 |
| 2022/0114476 A1* | 4/2022 | Bui | G06N 3/084 |
| 2022/0114595 A1* | 4/2022 | Balayan | G06N 3/045 |
| 2022/0137961 A1* | 5/2022 | Quirynen | G06F 9/3836 712/210 |
| 2022/0138555 A1* | 5/2022 | Zhang | G06V 10/454 706/20 |
| 2022/0147829 A1* | 5/2022 | Kubota | G06N 10/60 |
| 2022/0156592 A1* | 5/2022 | Ramasamy Selvaraju | G06V 10/82 |
| 2022/0156593 A1* | 5/2022 | Liu | G06F 18/2155 |
| 2022/0157046 A1* | 5/2022 | Chen | G06N 3/084 |
| 2022/0164636 A1* | 5/2022 | Fadaie | G06N 20/00 |
| 2022/0165045 A1* | 5/2022 | Jiang | G06V 10/25 |
| 2022/0179374 A1* | 6/2022 | Kaberg Johard | G06F 30/27 |
| 2022/0180173 A1* | 6/2022 | Jonnalagadda | G06N 3/04 |
| 2022/0180189 A1* | 6/2022 | Adrian | G06N 3/045 |
| 2022/0180528 A1* | 6/2022 | Dundar | G06N 20/00 |
| 2022/0198254 A1* | 6/2022 | Dalli | G06N 3/042 |
| 2022/0199258 A1* | 6/2022 | Yoo | G06N 3/091 |
| 2022/0222552 A1* | 7/2022 | Myojin | G06F 18/2193 |
| 2022/0222934 A1* | 7/2022 | Zhang | G06N 5/01 |
| 2022/0229400 A1* | 7/2022 | Soler Garrido | G06N 3/088 |
| 2022/0230056 A1* | 7/2022 | Soler Garrido | G06N 3/088 |
| 2022/0230066 A1* | 7/2022 | Das | G06N 3/045 |
| 2022/0237890 A1* | 7/2022 | Choi | G06N 3/082 |
| 2022/0253670 A1* | 8/2022 | Rekaya | G06N 3/048 |
| 2022/0253674 A1* | 8/2022 | Sakemi | G06N 3/049 |
| 2022/0253721 A1* | 8/2022 | Xu | G06Q 30/0631 |
| 2022/0261626 A1* | 8/2022 | Liu | G06N 3/063 |
| 2022/0261651 A1* | 8/2022 | Woo | G06N 3/04 |
| 2022/0261948 A1* | 8/2022 | Appu | G06F 9/30014 |
| 2022/0268964 A1* | 8/2022 | Choi | G01W 1/14 |
| 2022/0269931 A1* | 8/2022 | Mellempudi | G06F 7/5443 |
| 2022/0269937 A1* | 8/2022 | Kim | G06N 3/08 |
| 2022/0269946 A1* | 8/2022 | Zhou | G06N 3/084 |
| 2022/0270509 A1* | 8/2022 | Josephson | G06F 3/0346 |
| 2022/0270711 A1* | 8/2022 | Feala | G16B 45/00 |
| 2022/0272345 A1* | 8/2022 | Besenbruch | H04N 19/91 |
| 2022/0277859 A1* | 9/2022 | Alesiani | G16H 20/10 |
| 2022/0283951 A1* | 9/2022 | Pathapati | G06F 9/5016 |
| 2022/0292300 A1* | 9/2022 | Pandey | G06N 3/08 |
| 2022/0292314 A1* | 9/2022 | Sminchisescu | G06V 40/107 |
| 2022/0292334 A1* | 9/2022 | Pandey | G06N 20/10 |
| 2022/0292342 A1* | 9/2022 | Ben-Itzhak | G06N 3/084 |
| 2022/0296169 A1* | 9/2022 | Alghorani | G06N 3/09 |
| 2022/0299952 A1* | 9/2022 | Salhov | G05B 13/048 |
| 2022/0301288 A1* | 9/2022 | Higuchi | G06V 10/764 |
| 2022/0303176 A1* | 9/2022 | Pandey | G06N 3/0495 |
| 2022/0309117 A1* | 9/2022 | Portman | G06Q 30/0201 |
| 2022/0309618 A1* | 9/2022 | DeLaRosa | G06N 3/0464 |
| 2022/0318572 A1* | 10/2022 | Ngo | G06N 3/04 |
| 2022/0319658 A1* | 10/2022 | Abraham | G06N 3/084 |
| 2022/0327365 A1* | 10/2022 | Kubota | G06N 3/084 |
| 2022/0327769 A1* | 10/2022 | Tsai | G06T 15/04 |
| 2022/0327811 A1* | 10/2022 | Quinton | G06N 3/045 |
| 2022/0329847 A1* | 10/2022 | Parashar | H04N 19/139 |
| 2022/0329966 A1* | 10/2022 | Kim | G06N 3/084 |
| 2022/0335274 A1* | 10/2022 | Rawat | G06F 18/214 |
| 2022/0366260 A1* | 11/2022 | Hirimbura Matara Kankanamge | G06N 3/048 |
| 2022/0367056 A1* | 11/2022 | Lure | G16H 30/40 |
| 2022/0374718 A1* | 11/2022 | Hamze | G06N 3/045 |
| 2022/0383092 A1* | 12/2022 | Zhao | G06N 3/04 |
| 2022/0383114 A1* | 12/2022 | Ghazvinian Zanjani | G06N 20/00 |
| 2022/0383119 A1* | 12/2022 | So | G06N 3/126 |
| 2022/0383138 A1* | 12/2022 | Phan | G06N 20/20 |
| 2022/0385907 A1* | 12/2022 | Zhang | G06N 3/08 |
| 2022/0398437 A1* | 12/2022 | Malinowski | G06N 3/084 |
| 2022/0405579 A1* | 12/2022 | Yu | G06N 3/084 |
| 2022/0405586 A1* | 12/2022 | Yonetani | G06N 3/08 |
| 2022/0414344 A1* | 12/2022 | Makki Niri | G06N 3/084 |
| 2022/0414461 A1* | 12/2022 | Shirahata | G06F 30/27 |
| 2022/0414475 A1* | 12/2022 | Cho | G06F 18/217 |
| 2022/0414972 A1* | 12/2022 | Rohrer | G06V 10/62 |
| 2022/0417108 A1* | 12/2022 | Mayyuri | H04L 41/16 |
| 2023/0011312 A1* | 1/2023 | Haderbache | G06F 30/27 |
| 2023/0016772 A1* | 1/2023 | Aoshima | G06N 3/044 |
| 2023/0019275 A1* | 1/2023 | Sombatsiri | G06N 3/084 |
| 2023/0022510 A1* | 1/2023 | Quirynen | G05B 13/048 |
| 2023/0033694 A1* | 2/2023 | McDonald | G06N 3/047 |
| 2023/0037498 A1* | 2/2023 | Kryzhanovskiy | G06N 3/08 |
| 2023/0038838 A1* | 2/2023 | Raghunathan | G05B 13/048 |
| 2023/0044102 A1* | 2/2023 | Anderson | G06N 20/20 |
| 2023/0054868 A1* | 2/2023 | Zhang | G06N 10/60 |
| 2023/0085880 A1* | 3/2023 | Lin | G06F 17/16 706/25 |
| 2023/0130638 A1* | 4/2023 | Sakai | G06N 3/045 706/25 |
| 2023/0144498 A1* | 5/2023 | Tran | G05B 13/048 700/29 |
| 2023/0177377 A1* | 6/2023 | Oh | G06N 3/084 716/100 |
| 2023/0196071 A1* | 6/2023 | Park | G06N 3/045 706/25 |
| 2023/0199117 A1* | 6/2023 | Koul | H04M 3/5158 379/201.01 |

OTHER PUBLICATIONS

Bracewell, R., "The Fourier Transform and Its Applications," McGraw-Hill International Editions, Electrical Engineering Series, Third Edition, 636 pages (2000).

Qu, Z. Q., "Model Order Reduction Techniques with Applications in Finite Element Analysis," Springer-Verlag London Ltd., 379 Pages (2004).

Asgari, S. et al., "Application of POD Plus LTI ROM to Battery Thermal Modeling: SISO Case," SAE International Journal of Commercial Vehicles, 2014-01-1843, pp. 278-285 (2014).

Ladeveze, P. et al., "The LATIN Multiscale Computational Method and the Proper Generalized Decomposition," Computer Methods in Applied Mechanics and Engineering, 199 (21-22), 18 pages (2010).

Carlberg, K. et al., "The GNAT Method for Nonlinear Model Reduction: Effective Implementation and Application to Computational Fluid Dynamics and Turbulent Flows," Journal of Computational Physics, Jul. 5, 2012, 33 pages.

Chaturantabut, S. et al., "A State Space Error Estimate for POD-DEIM Nonlinear Model Reduction," SIAM Journal on Numerical Analysis, vol. 50, No. 1, pp. 46-63 (2012).

Pascanu, R. et al., "On the Difficulty of Training Recurrent Neural Networks," International Conference on Machine Learning, 9 pages (2013).

Lecun, Y. et al., "Deep Learning," Nature, vol. 521, May 28, 2015, pp. 436-444.

Gers, F. et al., "Learning to Forget: Continual Prediction With LSTM," Artificial Neural Networks, Sep. 7-10, 1999, Conference Publication No. 470, pp. 850-855.

Xiao, D. et al., "Non-Intrusive Reduced Order Modelling of the Navier-Stokes Equations," Computer Methods in Applied Mechanics and Engineering, Dec. 13, 2018, 28 pages.

(56) References Cited

OTHER PUBLICATIONS

Siegelmann, H. et al., "Computational Capabilities of Recurrent NARX Neural Networks," IEEE Transactions on Systems Man, and Cybernetics—Part B: Cybernetics, vol. 27, No. 2, Apr. 1997, pp. 208-215.

* cited by examiner

600

700a

SYSTEMS AND METHODS FOR BUILDING DYNAMIC REDUCED ORDER PHYSICAL MODELS

CROSS-REFERENCE TO RELATED APPLICATIONS

This application claims priority to U.S. Provisional Patent Application No. 62/773,555, filed Nov. 30, 2018, entitled "SYSTEMS AND METHODS FOR BUILDING DYNAMIC REDUCED ORDER PHYSICAL MODELS," which is incorporated herein by reference in its entirety.

BACKGROUND

Reduced order modeling (ROM) is relatively well mastered for most dynamic linear systems. The ANSYS LTI-ROM (Linear Time Invariant) is representative of the state of the art in this field.

However, the inherent physical instability issue can arise in the nonlinear transient case. In this context, instability means that a small perturbation of input data or of model parameters may lead to a large deviation of the solution. Two groups of intrusive and non-intrusive methods have been applied in this challenging problem to approximate the physics solver by a ROM.

Intrusive methods are the state of the art. The solution is expressed as a linear combination of a reduced basis. The coefficients of the linear combination are obtained by solving equilibrium equations. These methods are called intrusive because the equilibrium equations are computed by the physics solver. Due to the instability issue, equilibrium equations have to be solved with a high accuracy. Some contribution to non-intrusive approaches consist in developing equilibrium equations outside the physics solver, such as an adaptation of the classical linear approach to the quadratic structure of the Navier-Stokes equations. The same method can have an intrusive or a non-intrusive implementation. A new solver may be developed based on adapting both approaches. In both intrusive and non-intrusive cases, the evaluation of the ROM can be expensive in computing time. Its adaptation to real time and embedded systems is not straightforward.

For non-intrusive methods, deep neural networks are the state of the art. They are designed to address artificial intelligence problems, where the response can be binary, such as 0 or 1. The recurrent form of neural networks allows also dynamic modelling. Nonlinear autoregressive models or nonlinear autoregression network with exogenous inputs (NARX) can improve the stability and the accuracy of the neural network model.

However, physics solvers are very time and computing resources consuming. Moreover, for complex nonlinear dynamic solvers, full automation is rarely possible and expert user settings are mandatory. Therefore, physics solver usage is limited to virtual prototyping applications in the design process. Due to the cost of such calculations, including physical solvers in digital twin is not possible. Moreover, coupling mesh-based physics solvers and system solvers (co-simulation) is very performance limited.

SUMMARY

Systems and methods are provided to obtain input data and output data of a physical system. The input data can represent a dynamic input excitation to the physical system over a period of time. The output data can represent a dynamic output response of the physical system responding to the dynamic input excitation over the period of time. A computing structure is trained with a plurality of input units and one or more output units, the plurality of input units including regular input units to receive the input data and the output data, the output units including one or more regular output units to predict a dynamic rate of change of the input data over the period of time. A simulation object is generated for the physical system, the simulation object including the trained computing structure to determine future output data of the physical system in real time.

Other features of the present disclosure will be apparent from the accompanying drawings and from the detailed descriptions that follow.

BRIEF DESCRIPTION OF THE DRAWINGS

The present disclosure is illustrated by way of example and not limitation in the figures of the accompanying drawings, in which like references indicate similar elements and in which.

DETAILED DESCRIPTION

Figure 1:
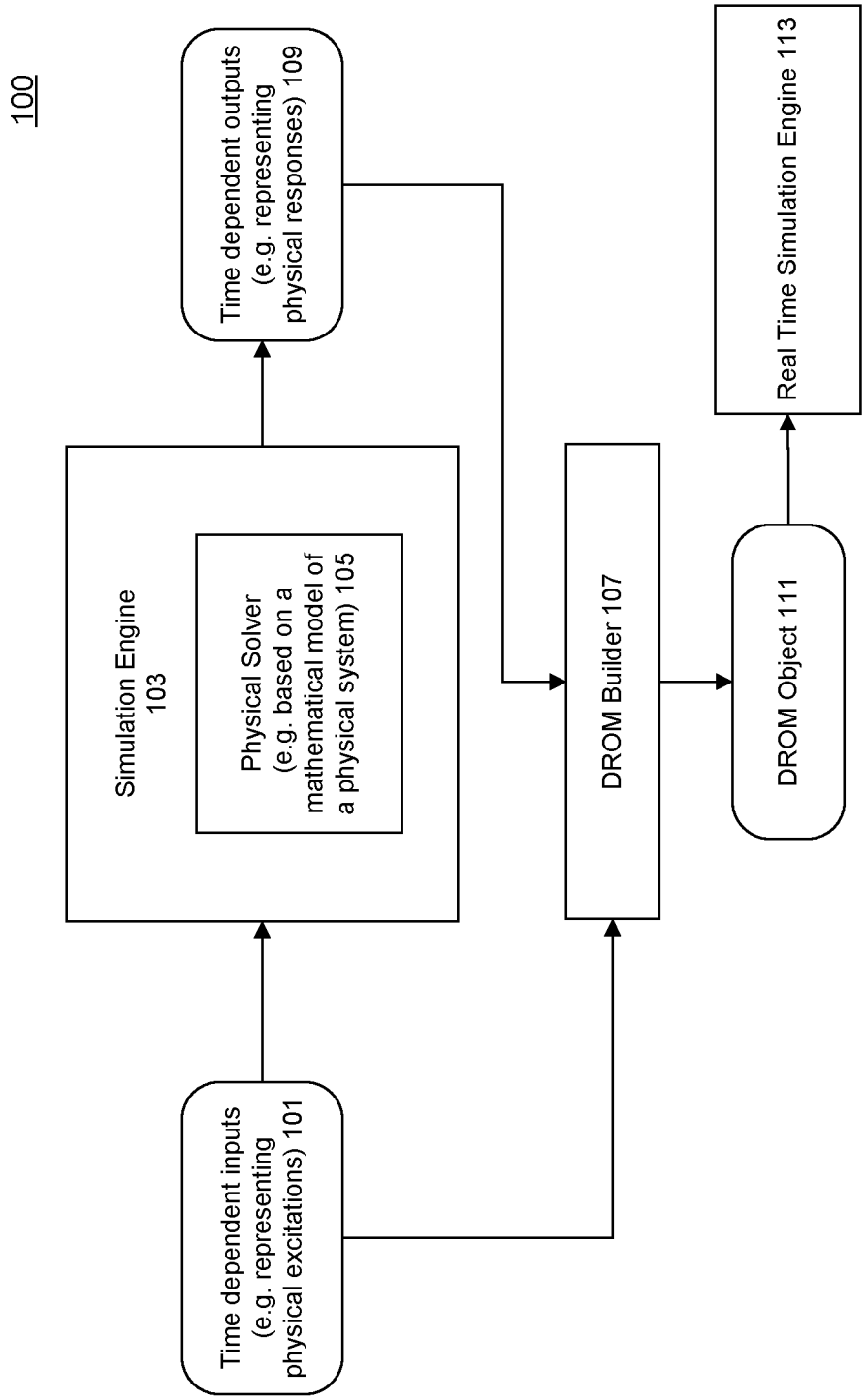
FIG. 1 is a block diagram illustrating one embodiment of a system for generating a dynamic ROM to perform real-time simulation.

Methods and apparatuses for building a DROM (dynamic reduced order models) are described herein. In the following description, numerous specific details are set forth to provide thorough explanation of embodiments of the present disclosure. It will be apparent, however, to one skilled in the art, that embodiments of the present disclosure may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the disclosure. The appearances of the phrase "in one embodiment" in various places in the specification do not necessarily all refer to the same embodiment.

The processes depicted in the figures that follow, are performed by the processing logic that comprises hardware (e.g. circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

A DROM (e.g. linear or non-linear) can be built from any physical solver solution. A tool can be provided with user interface and an executable module to perform algorithmic and non-algorithmic operations based on a generic and non-intrusive workflow for DROM creation. In some embodiments, the DROM creation can correspond to an identification of the nonlinear differential equations which relate solver inputs to solver outputs. It provides real time approximation of the physical solver results for any time varying (or dynamic) solver inputs.

A solver may include apiece of software which can be executed to solve a mathematical problem, such as a formulation (e.g. based on a set of mathematical equations) of a physical process or real-life process. A physical (or physical) solver may require complex numerical simulations based on mathematical models or formulations of physical processes. Model order reduction can be applied to lower the computational complexity due to complexity and large size (dimension) of the mathematical models. By a reduction of the model's associated state space dimension or degrees of freedom, an approximation to the original model can be computed as a reduced order model.

The disclosed mechanism can enable the creation of a DROM, e.g. according to a physics solver, that will give access to substantially the same or similar results as the physics solver in real time with a controlled accuracy and without any user attention required during the creation. For example, a generic workflow for building a DROM of a full physical solver (e.g. based on an original mathematical model) can include creating associations between dynamic solver inputs and dynamic solver outputs calculated by the full physical solver with controlled accuracy of dynamic outputs of the DROM and corresponding dynamic outputs of the full physical solver.

The DROM can be built without requiring residual evaluations, nor access to the solver internal operators. Once this DROM is produced, it can be consumed to provide a good approximation of the dynamic solver outputs much faster than the classical solver processing (e.g. based on the physical solver model) step for any dynamic input variation. A DROM can include a standalone digital object or executable structure which can be consumed in a wide variety of new applications including system simulation, IoT (Internet of Things) and digital twin.

In one embodiment, a DROM may be configured with a free variable structured as an input unit of the DROM but not to be fitted or constrained with input data or learning data. The introduction of the free variables can allow the DROM to capture (e.g. during a learning process to build the DROM) various effects, such as delay, hysteresis, complex nonlinearities, low frequency, or other applicable phenomena in complex physical systems modeled. A variable may denote a name of a value. Alternatively, a variable may refer to a storage location (e.g. a memory cell of a storage device) where a value of the variable can be located.

A free variable may be related to a variation of a memory cell in a Short-Term Memory (LSTM) employed in various AI (artificial intelligence) technologies, such as neural networks. LSTM can be based on discrete times, $t \in \{1,2, \ldots, k, \ldots\}$. The memory cell is internal to the neural network. Although LSTM Neural networks can be used to implement a model based on Euler type scheme with constant time step. However, such LSTM Neural networks are too poor for real life applications. For example, LSTM neural networks may not converge to a configuration (e.g. during a learning process) to provide an approximation to a physical system with reasonable accuracy.

In one embodiment, a DROM can include a neurol network to approximate a physical model based on a set of differential equations to model a physical phenomenon in a continuous time domain. An integration scheme to build the DROM for the underlying physical model can adopt a time step (e.g. discrete time interval) in local manner. For example, the time step can be small (or reduced) if the modelled phenomenon is stiff (e.g. with large variation in a unit time) and it can be large (or enlarged) if the phenomenon is smooth (e.g. with small variation in a unit time).

A free variable can be introduced in a neural network to be associated with a memory cell (or node) not hidden in the neural network. A node can be a basic unit of computation including a storage of the memory cell. The modelled phenomena may be obtained by a portion of output nodes of a trained neural network. The memory cell of a free variable may be free from f(e.g. not belonging to) the portion of output nodes for generating the modelled phenomena (e.g. predicted output data of a physical system) during simulation. In some embodiments, the memory cell of the free variable may be external to (e.g. not hidden inside) a trained neural network. The variation of value stored in the memory cell shall be adapted to the time step.

FIG. 1 is a block diagram illustrating one embodiment of a system for generating a dynamic ROM to perform real-time simulation according to one embodiment described herein. System 100 can include a work flow to generate DROM object 111 by DROM builder 107 based on simulation results from simulation engine 103. DROM object 111 can be executed for real time simulation engine 113 to perform real time simulation of a physical system or real-life system modeled by simulation engine 103. System 100 may comprise computing components (e.g. simulation engine 103, DROM builder 107, real time simulation engine 113, DROM object 111 etc.) locally coupled and/or remotely coupled via a networked environment.

Simulation engine 103 may include physical solver 105, such as a 3D solver to provide a solution to a mathematical model of a physical system. Simulation engine 103 can be executed to generate or simulate time dependent output (or dynamic output) 109 in response to receiving time dependent inputs (or dynamic inputs) 101. Time dependent outputs 109 may correspond to physical responses of a physical system modeled by physical solver 105 when receiving physical excitations as time dependent inputs 101. Time dependent inputs 101 and time dependent outputs 109 can represent one or more values of velocity, temperature, sounds, pressure, or other applicable physical (e.g. mechanical, thermal, acoustic etc.) or real-life phenomena/characteristics (e.g. measurable physical properties) over time (e.g. as functions of time).

Physical solver 105 may be configured based on a mathematical formulation to model a physical system which exhibits physical responses in response to physical excitations, substantially the same with or similar to how time dependent outputs 109 and time dependent inputs 101 are related. In some embodiments, physical solver 105 may perform numerical analysis operations to identify approximated numerical solutions to a mathematical model (e.g. based on differential equations) for generating time dependent outputs 109 in response to time dependent inputs 101. Numerical analysis operations may require considerable amount of computing resources.

In one embodiment, DROM builder 107 can receive time dependent inputs 101 and corresponding time dependent outputs 109 to generate a DROM object 111 with a computation structure which captures dynamic relationships between time dependent inputs 101 and time dependent outputs 109 substantially similar to a physical model which provides time dependent outputs 109 in response to time dependent inputs 101. In response to receiving the same set of inputs, DROM object 111 may generate the same or substantially similar corresponding outputs as what physical solver 105 would generate, while taking significantly less amount of computing resources (e.g. amount of time needed for the computation). As such, real time simulation engine 113 may include DROM object 111 to perform real time simulation of a physical model embedded inside physical solver 105.

Figure 2:
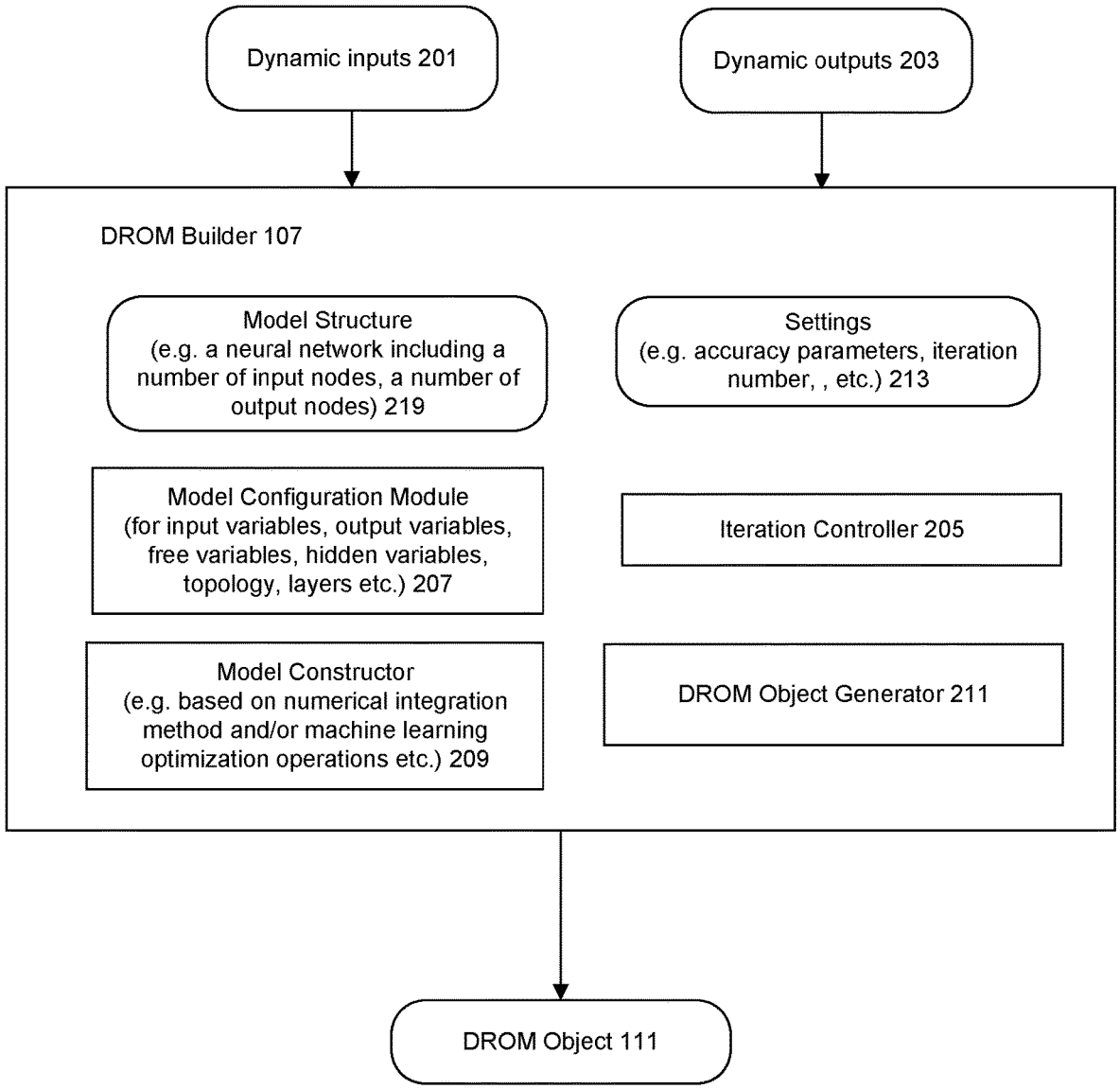
FIG. 2 is a block diagram illustrating an exemplary system for building a dynamic ROM.

FIG. 2 is a block diagram illustrating an exemplary system 200 for building a dynamic ROM, such as DROM builder 107 of FIG. 1. In one embodiment, system 200 may include computation structures adaptable via learning operations to capture a corresponding mathematical model or a physical system between dynamic inputs 201 (e.g. time dependent input 107) and dynamic outputs 203 (e.g. time dependent outputs 109). Dynamic inputs 201 and dynamic outputs 203 may be obtained from a physical solver, such as physical solver 105 of FIG. 1. Alternatively or optionally, dynamic inputs 201 and dynamic outputs 203 may be derived from actual measurements (e.g. with noises filtered) of the real physical system over a period of time.

DROM builder 107 may include settings 213 configured (pre-configured or dynamically configured) for control learning operations to adapt or update model structure 219 for modeling a physical system associated with dynamic inputs 201 and dynamic outputs 203. For example, settings 213 may can include accuracy parameters specifying a requested accuracy for determining when model structure 219 can estimate dynamic outputs 203 with a sufficient accuracy in response to dynamic inputs 201 without a need to perform further learning operations. Optionally or additionally, settings 213 may include a maximum iteration number to limit number of learning cycles to determine whether a learning process can converge to a solution to update model structure 219 with a desired accuracy. Other applicable control specifications can be included in settings 213.

Model structure 219 may include an adaptable computational structure, based on software, hardware or a combination of both, to simulate a mathematical model or an actual physical system. For example, model structure 219 may include a neural network with a number of input nodes and a number of output nodes. Model structure 219 can have adaptable parts or logics for predicting dynamic outputs 203 from dynamic inputs 201. Adaptable logics may correspond to, for example, weights, relationships between variables, strength of connections, or other applicable variable values which can be assigned during a learning process. Model structure 219 may include storages or hardware/software logics corresponding to input variables, output variables, free variables, hidden variables, or other applicable variables to perform computation according to a mathematical model.

Model configuration module 207 can specify relationships between dynamic inputs 201/dynamic outputs 203 and input variables, output variables or free variables of model structure 219. In one embodiment, input variables may be constrained by values of dynamic inputs 201 and dynamic outputs 203. Output variables may be constrained by rate of changes of dynamic inputs 201 and free variables. A free variable may be assigned dynamic values free from (or without) direct constraints from (or a prespecified relationships with) any of dynamic inputs 201 and dynamic outputs 203.

Model configuration module 207 can update computational architecture of model structure 219. For example, model configuration module 207 can add or remove a free variable in variable configurations 215. Model configuration module 207 can impose a topology in module structure 219. A topology can specify interrelations or arrangements between nodes (e.g. layers of connections, size of layers etc.) in a computational network, such as a neural network.

In one embodiment, model constructor 209 can perform learning operations to update model structure 219 to predict or generate dynamic outputs 203 from dynamic inputs 201. For example, learning operations can be based on numerical integration method and/or machine learning optimization operations to update weights associated with links between nodes in a neural network in model structure 219. Model constructor 209 can measure an accuracy of adapted module structure 219 as an estimation or prediction error or difference between estimated dynamic outputs and time dependent outputs 203 in response to time dependent inputs 201 for each learning cycle.

Iteration controller 205 can iteratively invoke cycles of learning operations via model constructor 209. In some embodiments, iteration controller 205 can initiate or conclude a learning cycle according to a comparison of the estimation error of model structure 219 and a desired accuracy specified in settings 213 (e.g. accuracy parameters). Iteration controller 205 may be configured to limit number of iterations allowed, specify actions to modify a learning cycle, and/or conditions to conclude or continue iterations of learning cycles, etc. In one embodiment, actions to modify a learning cycle may include adding a free variable in variable configurations 215, e.g. via model configuration module 207.

Once model structure 219 has been successfully adapted via learning cycles, DROM object generator 211 may generate DROM object 111 as an executable object according to model structure 219. In some embodiments, DROM object 111 may include a library or an executable code package with interface mechanisms to allow integration with a real time simulation environment, such as simulation engine 113 of FIG. 1.

Figure 3A:
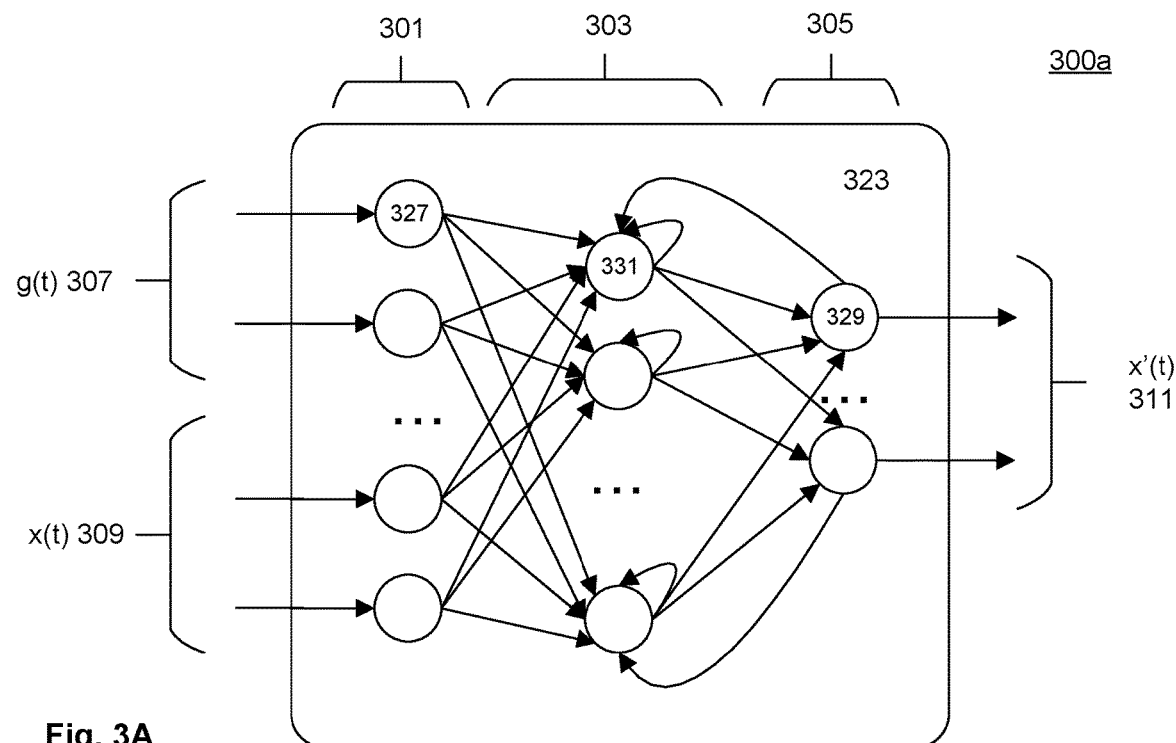
FIG. 3A is block diagram illustrating a neural network configured to model a physical system.
Figure 3B:
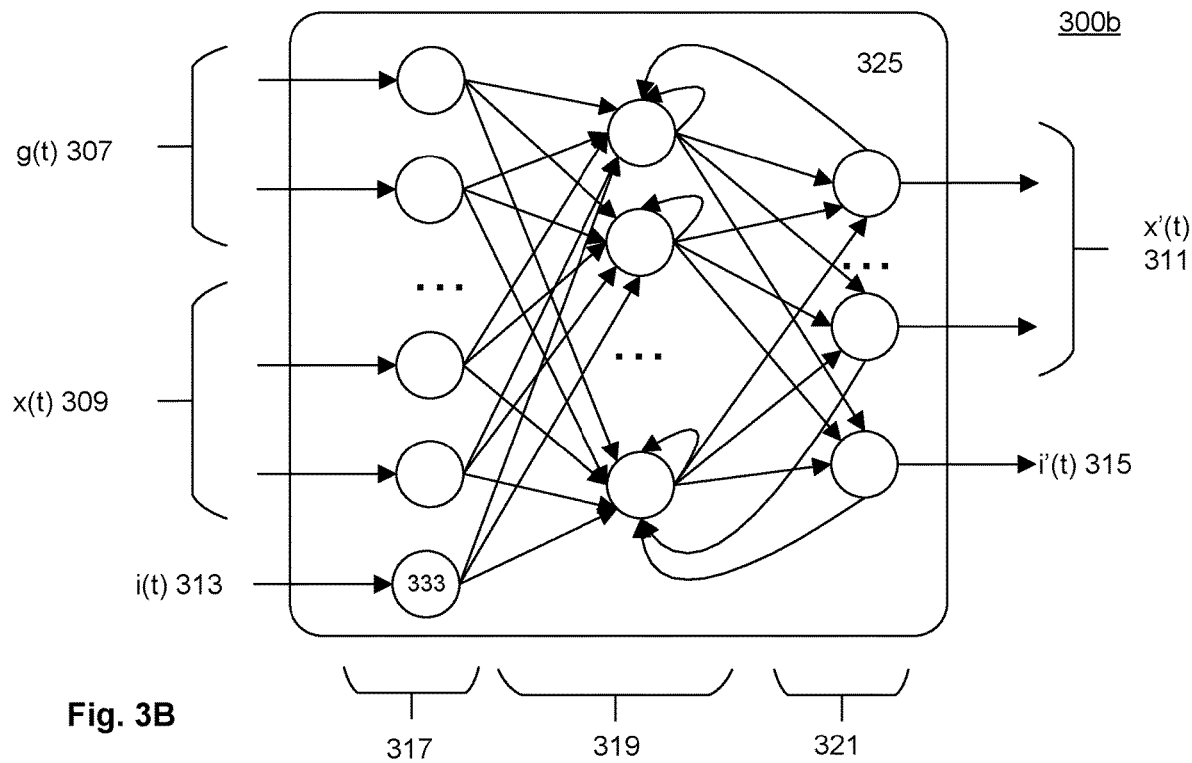
FIG. 3B is block diagram illustrating a neural network configured with a free variable to model a physical system.

FIGS. 3A-3B are block diagrams illustrating a free variable and neural networks configured to model physical systems. For example, network 300a or 300b may be part of model structure 219 of FIG. 2. In one embodiment, network 300a may be configured as a recurrent neural network with multiple layers of nodes. Input layer 301 may include input nodes to receive dynamic inputs 309 and dynamic outputs 307. Output layer 305 may include output nodes to provide output values corresponding to rates of change 311 of dynamic inputs 309. Hidden layer 303 may include hidden nodes not directly accessible or constrained via dynamic inputs 309 and dynamic outputs 307.

Network 300b may be configured as a recurrent neural network with multiple layers of nodes. Hidden layer 319 may include hidden nodes. Input layer 317 may include input nodes to receive dynamic inputs 309, dynamic outputs 307 and a free variable 313 which is free from direct relationships with dynamic inputs 309 or dynamic outputs 307. Output layer 321 may include output nodes to provide output values corresponding to rates of change 311 of dynamic inputs 309 and a rate of change 315 of free variable 313. In one embodiment, dynamic values of free variable 313 may be designated according to a boundary condition and rate of change 315 provided via output layer 321.

Figure 4:
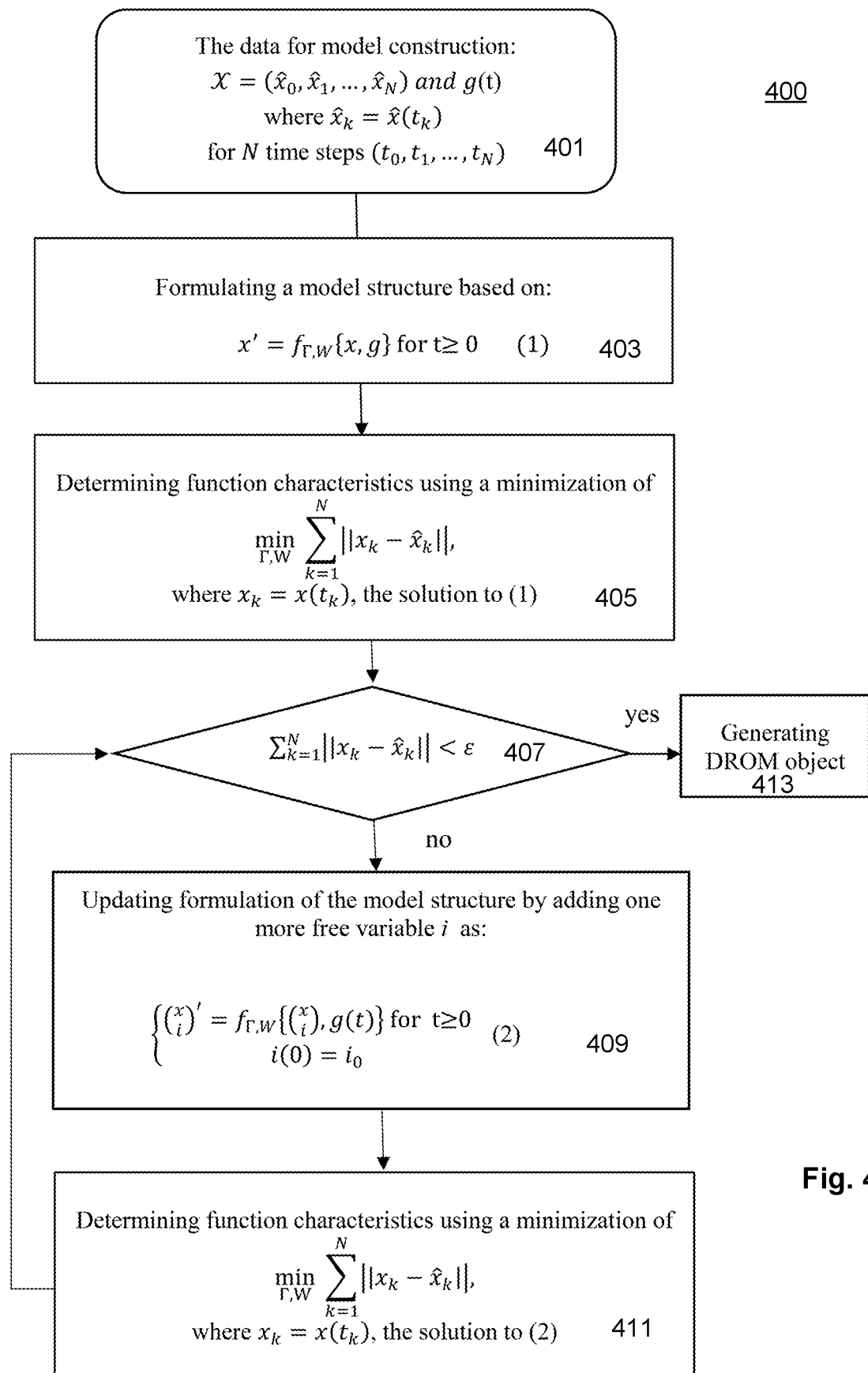
FIG. 4 is a flow diagram illustrating one embodiment of a process to build a computing structure for a DROM object.

FIG. 4 is a flow diagram illustrating one embodiment of a process to build a computing structure for a DROM object. Exemplary process 400 may be performed by a processing logic that may include hardware (circuitry, dedicated logic, etc.), software (such as is run on a dedicated machine), or a combination of both. For example, process 400 may be performed by system 200 of FIG. 2. Data input 401 can include dynamic output $X=(\hat{x}_0, \hat{x}_1, \ldots, \hat{x}_N)$ and dynamic input g(t) of a physical system for N time steps. In one example, X and g(t) can be obtained from a dynamic physical solver (e.g. a software module including a physical model to simulate a physical phenomena of a physical system). A physical solver can compute one or more outputs (t)from one or more dynamic inputs g(t). A physical solver could be any set of partial derivative equations discretized in time solver (e.g. ANSYS Fluent® or ANSYS Mechanical®) or a combination of those solvers. A physical solver can accurately compute $\hat{x}(t)$ from an initial condition $\hat{x}(t=0)$ using the proper time discretization associated to the described physics. In some embodiments, dynamic outputs X and dynamic inputs g(t) can be received from measurements of physical characteristics of a physical system.

At block 403, the processing logic of process 400 can formulate or configure a model structure based on a formulation $f_{\Gamma,w}$ corresponding to the nonlinear function to be identified which can be computed using a neural network, such as structure 219 of FIG. 2. Any admissible neural network, such as a feed forward neural network, can be used. An admissible neural network for modeling $f_{\Gamma,w}$ (e.g. describing physics) may include several input cells which equals to the sum of the number of variables of x(t), the number of variables of g(t) and the bias of the neural network.

Γ, W respectively represent the topology of the neural network and the weights of each link. A topology of a neural network may include several layers with several cells (or units, nodes etc.) in each layer. These layers may include an input layer, one or more hidden layers and an output layer. An example topology of the neural network may comprise only three layers which can be enough to model the computation of a physical solver or a dynamic characteristic of a physical system. The complexity of the problems in training the neural network depends mainly on the total number of layers (or depth) of the neural network after a number of time steps. For example, if a neural network has N layers, its depth after 1000 time steps is 1000*N and the complexity of these problems is exponentially related to the depth 1000*N.

The identification of $f_{\Gamma,w}$ can follow an iterative process. Each iteration may correspond to a training session of the neural network. Each training session may include a set of machine learning optimization operations (e.g. one or more epochs of training iterations) in training the neural network based on a training configuration including a set of training data of g(t), x(t) as inputs and x'(t) based on a time step as outputs. Input x(t) and outputs x(t)' of the neural network can be related according to a time derivative relationship (e.g. based on a time step as configured). A loss of a training session, e.g. as a measure related to the accuracy of a model based on the neural network, may be obtained or computed based on a residual $\|x(t)-\hat{x}(t)\|$.

The accuracy may be user defined or configured. For example, in a thermal simulation, the output accuracy of the model could be defined with a maximum error of 1° F. or 1% in global precision. A global precision may depend on $\|x-\hat{x}\|$, wherein $\|.\|$ denotes the L2 norm or the Euclidean norm corresponding to the distance of a vector coordinate from the origin of the vector space. Accuracy ε can be a user defined parameter, such as $10^{-2} \times \|\hat{x}\|$ or other applicable values dependent on dynamic outputs provided.

At block 405, the processing logic of process 400 can perform a first iteration of machine learning operations to build (or determine function characteristics of) a model x(t) from one or more dynamic outputs (e.g. provided by the solver $\hat{x}(t)$) corresponding to one or more dynamic inputs g(t) within a requested accuracy ε (e.g. $\|x(t)-\hat{x}(t)\|<\varepsilon$). In other words, the machine learning optimization operations or other applicable optimization steps are performed to identify Γ, W of the neural network to minimize the residual $\|x(t)-\hat{x}(t)\|$.

In one embodiment, the optimization steps can include updating the neural network with additional hidden cells (units or variables) depending on whether the residual of an identified model is greater than the accuracy measure e. For example, if the residual is greater than the accuracy measure a, the neural network can be updated with an additional hidden cell to a hidden layer (e.g. of a three-layer network). Another set of machine learning optimization operations can then be performed to obtain another loss (or residual) based on the same training configurations. If there is insufficient amount of reduction of the newly obtained loss compared to the loss of the previous training result on the originally configured neural network without the hidden variable, the hidden variable may be removed from the neural network.

At block 407, the processing logic of process 400 can determine if the result of an iteration of the optimization process achieves the accuracy as targeted or configured. If the accuracy is achieved, the processing logic of process 400 can generate a DROM object based on the model identified at block 413.

Otherwise, at block 409, the processing logic of process 400 can update the neural network with an introduction of a new free variable i(t). For example, the updated neural network can correspond to a structure of the model specified as:

$$\begin{pmatrix} x(t) \\ i(t) \end{pmatrix}' = f_{\Gamma,W}\left\{\begin{pmatrix} x(t) \\ i(t) \end{pmatrix}, g(t)\right\} \text{ for } t \geq 0$$

Where:
( )' is the time derivative operator.
$f_{\Gamma,w}$ corresponds to the nonlinear function to be identified.
Γ, W are respectively the topology of the neural network and the weights of each link.
i(t) corresponds to the free variables which could be added to account for history effect and non-linearities. A free variable may be added as a new cell (or memory cell) to the input and a corresponding new cell to the output of the neural network (e.g. recurrent neural network or a feedforward neural network).

At block 409, the processing logic of process 400 can perform another iteration of the machine learning or optimization operations (e.g. as a training process) to identify the model x(t) with an additional free variable. In one embodiment, the optimization operations can correspond to a process to model a solution of differential equations (1) and (2) based on any numerical integration method, such as Euler scheme:

$$x_{k+1} = x_k + \Delta t_k f_{\Gamma,W}\{x_k, g_{k+1}\}$$

$$\begin{pmatrix} x_{k+1} \\ i_{k+1} \end{pmatrix} = \begin{pmatrix} x_k \\ i_k \end{pmatrix} + \Delta t_k f_{\Gamma,W}\left\{\begin{pmatrix} x_k \\ i_k \end{pmatrix}, g_{k+1}\right\}$$

where $\Delta t_k = t_{k+1} - t_k$, $x_k = x(t_k)$ and $g_k = g(t_k)$.

For example, the neural network can be updated with an introduction of a free variable as an additional input cell to the input layer and an additional output cell to the output layer. The additional output cell can be related to the additional input cell according to the time derivative relationship between corresponding input and output cells for x(t). A model for the new $f_{\Gamma,w}$ and the initial value i(0) is identified using similar technics applied in the first iteration of the process until convergence to the requested accuracy.

Training of the neural network with a free variable i(t) may include adjusting the initial value of the corresponding input cell (e.g. i(0)) based on back propagation algorithm. For example, new i(0)=old i(0)−η$\nabla_i \|x(t)-\hat{x}(t)\|^2$, where η is the learning rate and $\nabla_i \|x(t)-\hat{x}(t)\|^2$ is the derivative of the error or loss with respect to the free variable i(t). Other neural network update techniques may be applicable for the training of i(0).

To take into account the effect of the time step on the memory variable i (called free variable), the memory variable i shall appear in the input and the output of $f_{\Gamma,w}$. The update or temporal variation of i can be proportional to the time step Δt. The time step and the scheme can be adapted to the modeled phenomena. Here, free variables aren't hidden. Free variables are impacted by the variable time step and the integration scheme of the differential equation.

In some embodiments, DROM can be built without using a neural network. For example, the identification of $f_{\Gamma,w}$ can be based on performing an optimization process to identify the coefficients of a quadratic equation without the formulation of a neural network.

At block 411, the processing logic of process 400 can perform another iteration of machine learning operations to build a model x(t) considering a requested accuracy ε (e.g. $\|x(t)-\hat{x}(t)\|<\varepsilon$). The processing logic of process 400 then iteratively proceeds to determine whether the model x(t) satisfies the accuracy requirement at block 407. The processing logic of process 400 can introduce additional free variable for each new iteration.

Figure 5:
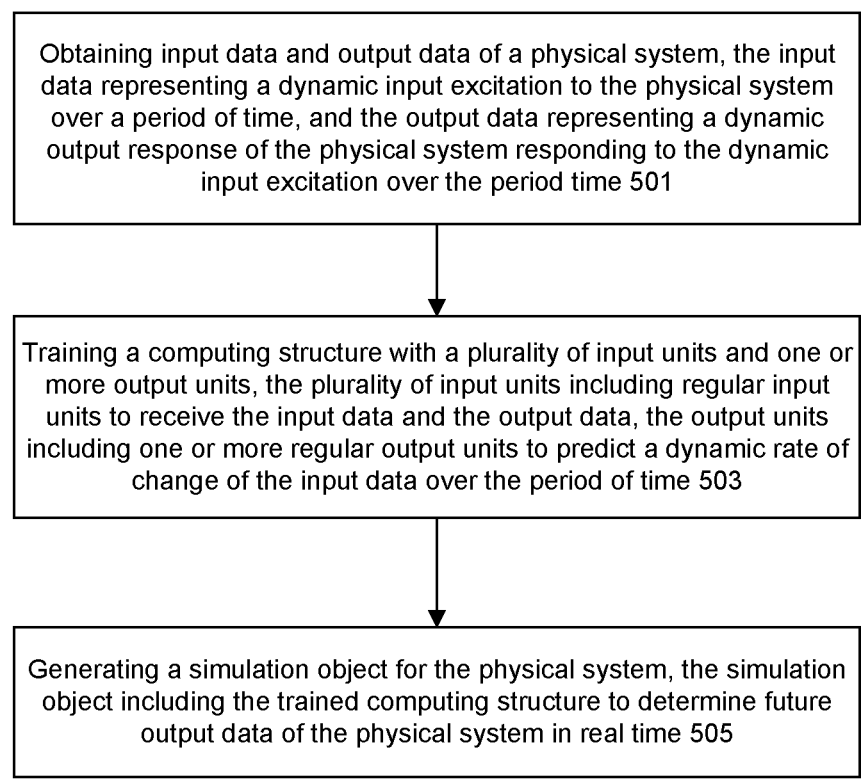
FIG. 5 is a flow diagram illustrating one embodiment of a process to train a computing structure for a DROM object.

FIG. 5 is a flow diagram illustrating one embodiment of a process to train a computing structure for a DROM object. Exemplary process 500 may be performed by a processing logic that may include hardware, software or a combination of both. For example, process 500 may be performed by system 200 of FIG. 2.

At block 501, the processing logic of process 500 can obtain or receive input data and output data of a physical system. The input data can represent a dynamic input excitation or physical excitation to the physical system over a period of time. The output data can represent a dynamic output response of the physical system according to or in response to the dynamic input excitation over the period time. In one embodiment, the output data may be obtained via executing a physical solver applied with the input data over the period of time. This physical solver may be configured to model physical properties of the physical system. Optionally or alternatively, the input data and output data may be provided by measuring excitation and response signals of the physical system. These signals may be filtered or smoothed to reduce noises that can adversely affect the effectiveness in building models of the physical system.

At block 503, the processing logic of process 500 can train a computing structure configured with a plurality of input units and one or more output units. The computing structure may be based on a neural network, such as recurrent neural network. Each unit may correspond to a node or cell of a neural network. The plurality of input units can include regular input units to receive the input data and the output data. The output units can include one or more regular output units to generate output signals of the computing structure for predicting a dynamic rate of change of the input data over the period of time.

In one embodiment, the processing logic of process 500 can configure inputs units and output units in the computing structure for training the computing structure to model the physical system. For example, the input units can be configured to include a free input unit separate from the regular input units. The free input unit is not configured (e.g. set up or connected) to receive the input data nor to receive the output data. The output units can be configured to include a free output unit separate from or in addition to the regular output units. The free input unit can provide a time varied data or signal (which is separate from input data) during the period of time for the training. The free output unit can provide a dynamic rate of change of the time varied data from the input unit during the period of time.

The free output unit and the free input unit of the computing structure may be configured respectively to provide a free output value and to receive a free input value. The processing logic of process 500 can assign the free input value for the free input unit such that the free output value corresponds to the dynamic rate of change of the free input value.

For example, the free input value can include an initial value at the start of the period of time for the training. The processing logic of process 500 can select or determine the initial value from a range of possible initial values considering achieving a desired accuracy of the physical model based the computing structure. In one embodiment, the selection may be performed according to a back-propagation algorithm. The predicted dynamic rate of change of the input data from the free output unit can be generated during the training according to the initial value selected, the input data and the output data.

The processing logic of process 500 can compare the dynamic rate of change of the input data and the predicted dynamic rate of change of the input data over the period of time for training the computing structure. The comparison may be performed to obtain a prediction residual indicating an accuracy of the predicted dynamic rate of change of the input data. The computing structure can be trained with the prediction residual within an accuracy threshold.

The processing logic of process 500 can perform training process on the computing structure in an iterative manner. For example, the computing structure can include structures configured or trained in a previous iteration of the training process. If the previous iteration is an initial iteration of the training process, the computing structure as configured in the previous iteration may not include any free input unit nor free output unit (e.g. for a free variable). Each iteration of the training process of the computing structure can be performed for the one or more regular output units to predict the dynamic rate of change of the input data according to the input data and the output data received via the regular input units over the period of time. A current iteration of the training process can be initiated because a prediction residual of the previous training iteration is outside of an accuracy threshold specified.

In one embodiment, the previously configured computing structure (e.g. a computing structure configured in the previous iteration of the training process) can include a number of input units and a number of output units. The number of input units can include the regular input units initially configured (e.g. for the first iteration) and a separate free input unit (e.g. a free input unit added for the previous iteration). The number of output units can include the output units as initially configured and a separate free output unit. The separate free input unit can provide a separate time varied data during the period of time, and the separate free output unit can provide a dynamic rate of change of the separate time varied data during the period of time.

In some embodiments, the computing structure can comprise a plurality of computation units related according to a directional topology including a plurality of connections (e.g. directed connections) associated with respective weights, each connection corresponding to a pair of neighboring computation units, each computation unit to provide an output value based on a combination of one or more input values received. The directional connection topology can include a recurrent network.

For example, one or more neighboring computation units of a particular one of the computation units can provide one or more output values received by the particular one computation unit as one or more input values of the particular computation units. The combination can depend on the one or more input values of the particular computation unit weighted by weights associated with connections from the one or more neighboring computation units. The predicted dynamic rate of change of the input data can correspond to output values provided by the regular output units. The processing logic of process 500 can determine the weights for the directional topology during the training process. The predicted dynamic rate of change of the input data can be generated according to the weights determined for the directional topology.

At block 505, the processing logic of process 500 can generate a simulation object for the physical system, such as DROM object 111 of FIG. 1. The simulation object can be used as the trained computing structure to determine future output data of the physical system in real time.

The methods and systems described herein may be implemented using any suitable processing system with any suitable combination of hardware, software and/or firmware, such as described below with reference to the non-limiting examples of FIGS. 6 and 7A-7C.

Figure 6:
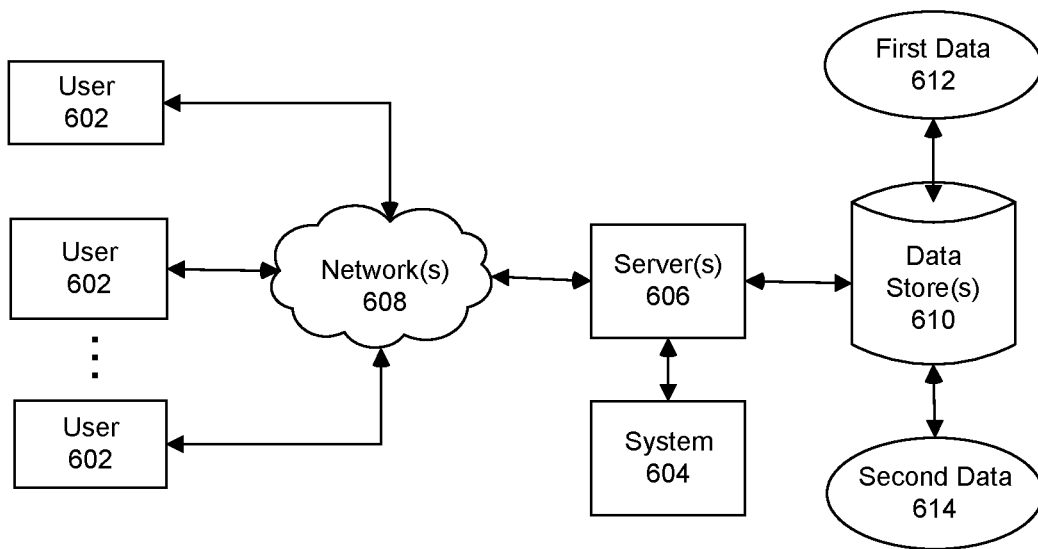
FIG. 6 depicts a computer-implemented environment which may be used in conjunction with the embodiments described herein.

FIG. 6 depicts a computer-implemented environment 600 wherein users 602 can interact with a system 604 hosted on one or more servers 606 through a network 608. The system 604 contains software operations or routines. The users 602 can interact with the system 604 through a number of ways, such as over one or more networks 608. One or more servers 606 accessible through the network(s) 608 can host system 604. The processing system 604 has access to a non-transitory computer-readable memory in addition to one or more data stores 610. The one or more data stores 610 may contain first data 612 as well as second data 614. It should be understood that the system 604 could also be provided on a stand-alone computer for access by a user.

Figure 7A:
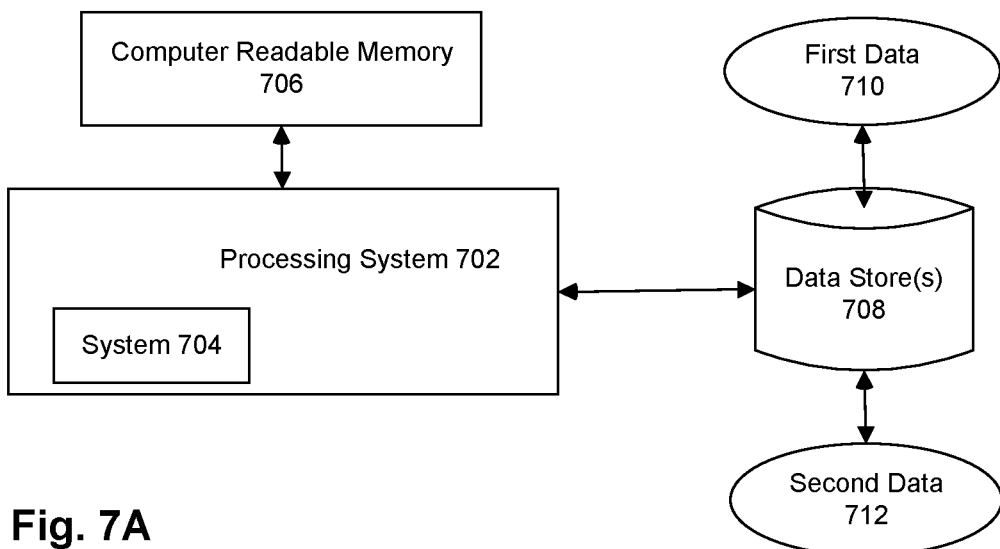
FIGS. 7A-7C depict example systems which may be used in conjunction with the embodiments described herein.
Figure 7B:
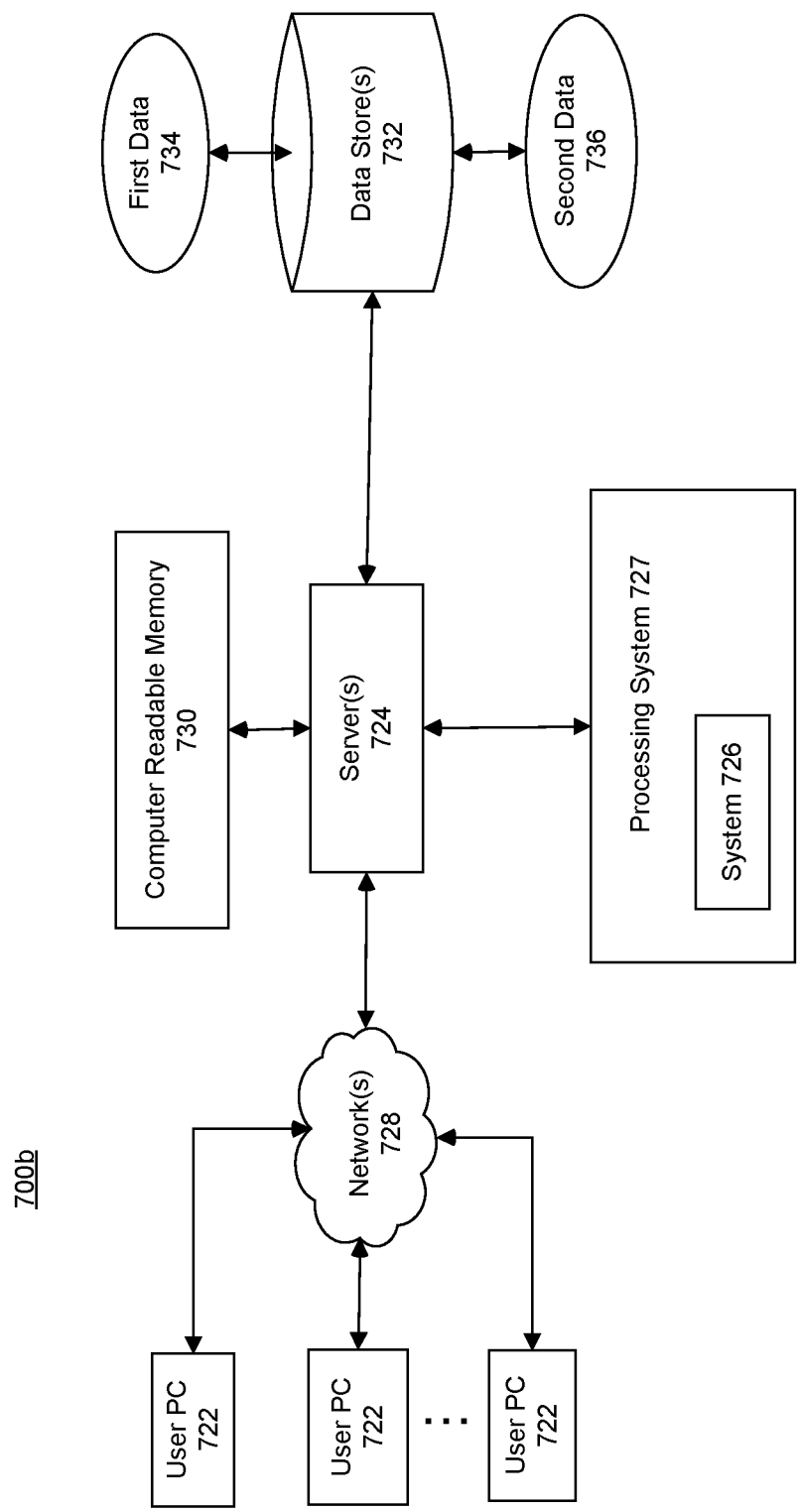
Figure 7C:
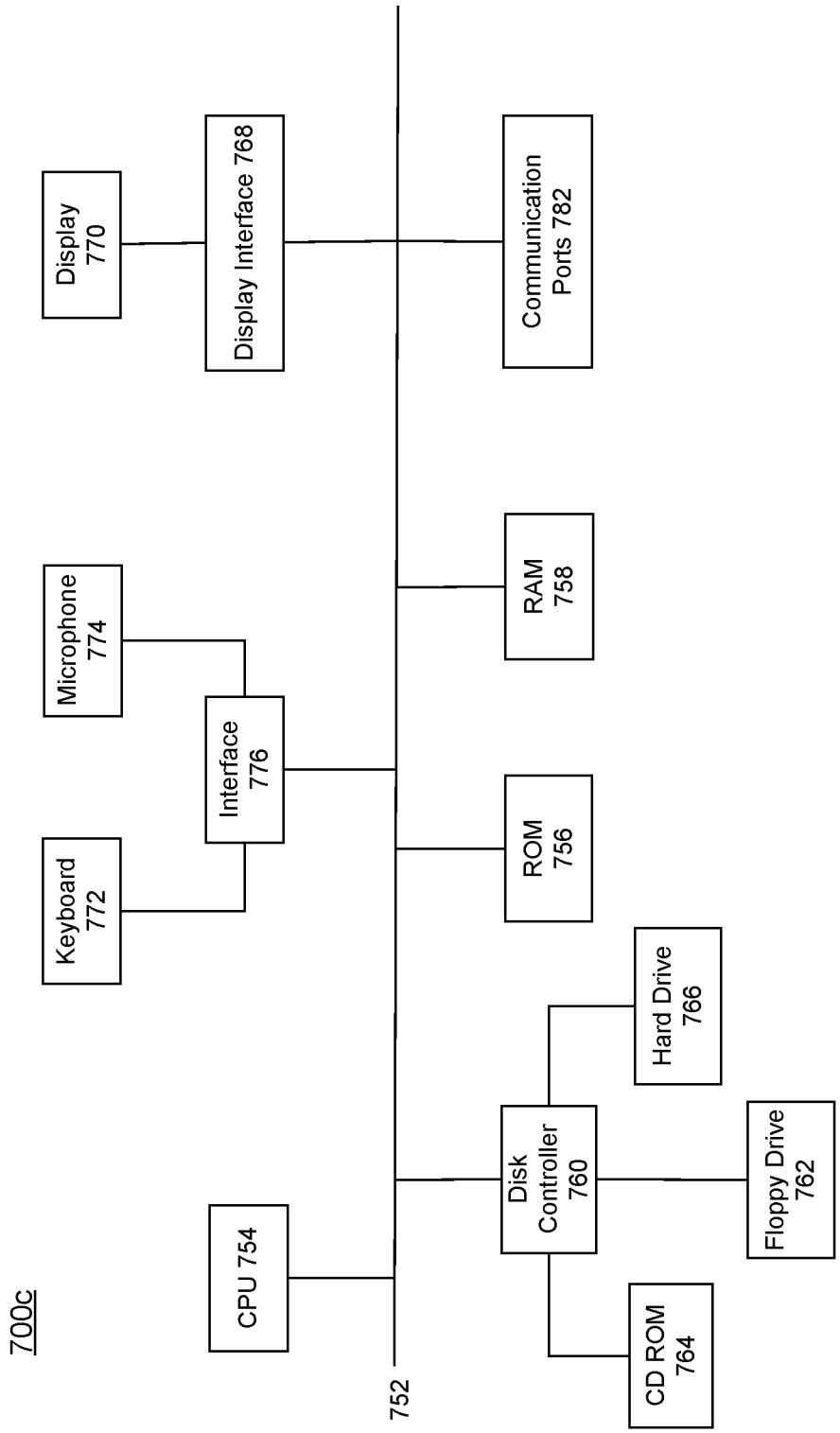

FIGS. 7A, 7B and 7C depict example systems for use in implementing a system. For example, FIG. 7A depicts an exemplary system 700a that includes a standalone computer architecture where a processing system 702 (e.g., one or more computer processors) includes a system 704 being executed on it. The processing system 702 has access to a non-transitory computer-readable memory 706 in addition to one or more data stores 708. The one or more data stores 708 may contain first data 710 as well as second data 712.

FIG. 7B depicts a system 700b that includes a client server architecture. One or more user PCs 722 can access one or more servers 724 running a system 726 on a processing system 727 via one or more networks 728. The one or more servers 724 may access a non-transitory computer readable memory 730 as well as one or more data stores 732. The one or more data stores 732 may contain first data 734 as well as second data 736.

FIG. 7C shows a block diagram of exemplary hardware for a standalone computer architecture 700c, such as the architecture depicted in FIG. 7A, that may be used to contain and/or implement the program instructions of system embodiments of the present disclosure. A bus 752 may serve as the information highway interconnecting the other illustrated components of the hardware. A processing system 754 labeled CPU (central processing unit) (e.g., one or more computer processors), may perform calculations and logic operations required to execute a program. A non-transitory computer-readable storage medium, such as read only memory (ROM) 756 and random access memory (RAM) 758, may be in communication with the processing system 254 and may contain one or more programming instructions. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium.

A disk controller 760 interfaces one or more optional disk drives to the system bus 752. These disk drives may be external or internal floppy disk drives such as 762, external or internal CD-ROM, CD-R, CD-RW or DVD drives such as 764, or external or internal hard drives 766. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 760, the ROM 756 and/or the RAM 758. Preferably, the processor 754 may access each component as required.

A display interface 768 may permit information from the bus 756 to be displayed on a display 770 in audio, graphic, or alphanumeric format. Communication with external devices may optionally occur using various communication ports 782.

In addition to the standard computer-type components, the hardware may also include data input devices, such as a keyboard 772, or other input device 774, such as a microphone, remote control, pointer, mouse, touchscreen and/or joystick. These input devices can be coupled to bus 752 via interface 776.

This written description describes exemplary embodiments of the disclosure, but other variations fall within scope of the disclosure. For example, the systems and methods may include and utilize data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

The methods and systems described herein may be implemented on many different types of processing devices by program code comprising program instructions that are executable by the device processing system. The software program instructions may include source code, object code, machine code, or any other stored data that is operable to cause a processing system to perform the methods and operations described herein. Any suitable computer languages may be used such as C, C++, Java, etc., as will be appreciated by those skilled in the art. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other non-transitory computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

What is claimed is:

1. A computer-implemented method comprising:
    obtaining input data and output data of a physical system, the input data representing a dynamic input excitation to the physical system over a period of time, and the output data representing a dynamic output response of the physical system to the dynamic input excitation over the period of time, the output data generated based on the input data over the period of time using a model of the physical system;
    training a computing structure with a plurality of input units and one or more output units, the plurality of input units including regular input units to receive the input data and the output data, the output units including one or more regular output units to predict a dynamic rate of change of the input data over the period of time, the computing structure including a neural network with the regular input units and the one or more regular output units, wherein the training the computing structure comprises:
        configuring the computing structure with the plurality of input units and the one or more output units, the computing structure configured to update the neural network with a free input added as an input unit in addition to the regular input units, the free input unit not configured to receive the input data or the output data, the computing structure configured to update the neural network with a free output unit as an output unit in addition to the one or more regular output units, the free input unit to provide a time varied data and a dynamic rate of change of the time varied data during the period of time,
        generating a predicted dynamic rate of change of the input data over the period of time based on the computing structure, the input data and the output data, and
        comparing the dynamic rate of change of the input data and the predicted dynamic rate of change of the input data over the period of time, the comparison to obtain a prediction residual indicating an accuracy of the predicted dynamic rate of change of the input data based on an accuracy threshold; and
    generating a simulation object for the physical system, the simulation object including the trained computing structure to determine future output data of the physical system in real time.

2. The method of claim 1, wherein a physical solver is configured to model physical properties of the physical system, and wherein the output data are obtained via an execution of the physical solver applied with the input data over the period of time.

3. The method of claim 1, wherein the computing structure comprises a previously configured computing structure, the previously configured computing structure configured without the free input unit and without the free output unit.

4. The method of claim 3, wherein the previously configured computing structure comprises the regular input units and the one or more regular output units, the method further comprising:
    training the previously configured computing structure for the one or more regular output units to predict the dynamic rate of change of the input data according to the input data and the output data received via the regular input units over the period of time.

5. The method of claim 4, wherein the previously configured computing structure is trained to predict the dynamic rate of change of the input data with a previous prediction residual, and wherein the previous prediction residual is outside of the accuracy threshold.

6. The method of claim 4, wherein the previously configured computing structure includes a number of input units and a number of output units, wherein the number of input units include the plurality of regular input units and a separate free input unit, wherein the number of output units include the one or more output units and a separate free output unit, the separate free input unit to provide a separate time varied data during the period of time, and the separate free output unit to provide a dynamic rate of change of the separate time varied data during the period of time.

7. The method of claim 1, wherein the computing structure comprises a plurality of computation units, the plurality of computation units including the input units and the output units, wherein the computation units are related according to a directional topology including a plurality of connections associated with respective weights, each connection corresponding to a pair of neighboring computation units, each computation unit to provide an output value according to one or more input value received.

8. The method of claim 7, wherein the output value is based on a combination of the one or more input values.

9. The method of claim 8, wherein one or more neighboring computation units of a particular one of the computation units provide one or more output values received by the particular one computation unit as one or more input values of the particular computation units.

10. The method of claim 9, wherein the combination depends on the one or more input values of the particular computation unit weighted by weights associated with connections from the one or more neighboring computation units.

11. The method of claim 10, wherein the predicted dynamic rate of change of the input data correspond to output values provided by the regular output units.

12. The method of claim 7, wherein the directional connection topology includes a recurrent network.

13. The method of claim 7, wherein the training further comprises:
determining the weights for the directional topology, wherein the predicted dynamic rate of change of the input data is generated according to the weights determined for the directional topology.

14. The method of claim 1, wherein the free output unit is configured to provide a free output value, wherein the free input unit is configured to receive a free input value, and wherein the training comprises:
assigning the free input value such that the free output value corresponds to dynamic rate of change of the free input value.

15. The method of claim 14, wherein the free input value includes an initial value for the period of time, and wherein the training further comprises:
selecting the initial value from a range of possible initial values, wherein the predicted dynamic rate of change of the input data is generated according to the initial value selected.

16. The method of claim 15, wherein the initial value is selected based on a back propagation algorithm.

17. A system, comprising:
a memory storing instructions;
one or more processors coupled to the memory, the one or more processors executing the instructions from the memory, the one or more processors configured to perform a method comprising:
obtaining input data and output data of a physical system, the input data representing a dynamic input excitation to the physical system over a period of time, and the output data representing a dynamic output response of the physical system to the dynamic input excitation over the period time, the output data generated based on the input data over the period of time using a model of the physical system;
training a computing structure with a plurality of input units and one or more output units, the plurality of input units including regular input units to receive the input data and the output data, the output units including one or more regular output units to predict a dynamic rate of change of the input data over the period of time, the computing structure including a neural network with the regular input units and the one or more regular output units, wherein the training the computing structure comprises:
configuring the computing structure with the plurality of input units and the one or more output units, the computing structure configured to update the neural network with a free input unit added as an input unit in addition to the regular input units, the free input unit not configured to receive the input data or the output data, the computing structure configured to update the neural network with a free output unit as an output unit in addition to the one or more regular output units, the free input unit to provide a time varied data and a dynamic rate of change of the time varied data during the periods of time,
generating a predicted dynamic rate of change of the input data over the period of time based on the computing structure, the input data and the output data, and
comparing the dynamic rate of change of the input data and the predicted dynamic rate of change of the input data over the period of time, the comparison to obtain a prediction residual indicating an accuracy of the predicted dynamic rate of change of the input data based on an accuracy threshold; and
generating a simulation object for the physical system, the simulation object including the trained computing structure to determine future output data of the physical system in real time.

18. A non-transitory computer-readable memory storing instructions for commanding one or more processors to:
obtain input data and output data of a physical system, the input data representing a dynamic input excitation to the physical system over a period of time, and the output data representing a dynamic output response of the physical system to the dynamic input excitation over the period time, the output data generated based on the input data over the period of time using a model of the physical system;
train a computing structure with a plurality of input units and one or more output units, the plurality of input units including regular input units to receive the input data and the output data, the output units including one or more regular output units to predict a dynamic rate of change of the input data over the period of time, the computing structure including a neural network with the regular input units and the one or more regular output units, wherein the training the computing structures comprises:
configuring the computing structure with the plurality of input units and the one or more output units, the computing structure configured to update the neural network with a free input unit added as an input unit in addition to the regular input units, the free input unit not configured to receive the input data or the output data, the computing structure configured to update the neural network with a free output unit as an output unit in addition to the one or more regular output units, the free input unit to provide a time varied data and a dynamic rate of change of the time varied data during the period of time,
generating a predicted dynamic rate of change of the input data over the period of time based on the computing structure, the input data and the output data, and comparing the dynamic rate of change of the input data and the predicted dynamic rate of change of the input data over the period of time, the comparison to obtain a prediction residual indicating an accuracy of the predicted dynamic rate of change of the input data based on an accuracy threshold; and generate a simulation object for the physical system, the simulation object including the trained computing structure to determine future output data of the physical system in real time.

\* \* \* \* \*